United States Patent [19]

Bridges

[11] Patent Number: 4,751,464
[45] Date of Patent: Jun. 14, 1988

[54] CAVITY RESONATOR WITH IMPROVED MAGNETIC FIELD UNIFORMITY FOR HIGH FREQUENCY OPERATION AND REDUCED DIELECTRIC HEATING IN NMR IMAGING DEVICES

[75] Inventor: James F. Bridges, St. Charles, Ill.

[73] Assignee: Advanced NMR Systems, Inc., Woburn, Mass.

[21] Appl. No.: 45,403

[22] Filed: May 4, 1987

[51] Int. Cl.$^4$ ............................................. G01R 33/20
[52] U.S. Cl. ..................................... 324/318; 324/322; 333/219
[58] Field of Search ................. 333/227, 219; 324/300, 324/307, 309, 311, 314, 318, 320, 322

[56] References Cited

U.S. PATENT DOCUMENTS

| | | | |
|---|---|---|---|
| 4,310,799 | 1/1982 | Hutchison | 324/319 |
| 4,439,733 | 3/1984 | Hinshaw | 324/322 |
| 4,506,224 | 3/1985 | Krause | 324/319 |
| 4,594,566 | 6/1986 | Maudsley | 324/318 |
| 4,616,181 | 10/1986 | Kemner | 324/318 |
| 4,628,264 | 12/1986 | Rzedzian | 324/322 |
| 4,638,253 | 1/1987 | Jaskolski | 324/318 |
| 4,641,097 | 2/1987 | Bottomley | 324/322 |
| 4,667,160 | 5/1987 | Krause | 324/316 |
| 4,686,473 | 8/1987 | Chesneau | 324/319 |
| 4,692,705 | 9/1987 | Hayes | 324/322 |

Primary Examiner—Michael J. Tokar
Attorney, Agent, or Firm—Ostrolenk, Faber, Gerb & Soffen

[57] ABSTRACT

A cavity resonator suitable for use in a high-speed nuclear magnetic resonance (NMR) imaging device comprises a plurality of transmission lines aligned parallel to a common axis and magnetically coupled to produce an essentially uniform dipole magnetic field perpendicular to the axis. The transmission lines are two conductor lines, with the first conductors being arranged inwardly of a second conductor common to all lines. The common conductor is symmetrically arranged about the axis of the resonator and constitutes a shield to contain the magnetic field within the cavity. The plurality of transmission lines are conductively isolated from each other but spaced in sufficiently close proximity to each to provide for strong mutual magnetic coupling amongst all transmission lines. A single inductive coupling loop may be provided for driving the resonator with a linearly polarized magnetic field and for receiving NMR information from the resonator. The use of a pair of inductive coupling loops spaced 90° about the resonator axis provides a circularly polarized magnetic field within the resonator when the loops are driven in electrical phase quadrature. Two inductive coupling loops for each imaging mode may be provided to eleminate undesirable modes and hence distortion in the NMR image. The common conductor and the longitudinal ends of the resonator are provided with slits designed to allow the changing high-speed gradient magnetic fields to fill the imaging volume fast enough to accomplish high-speed imaging.

16 Claims, 8 Drawing Sheets

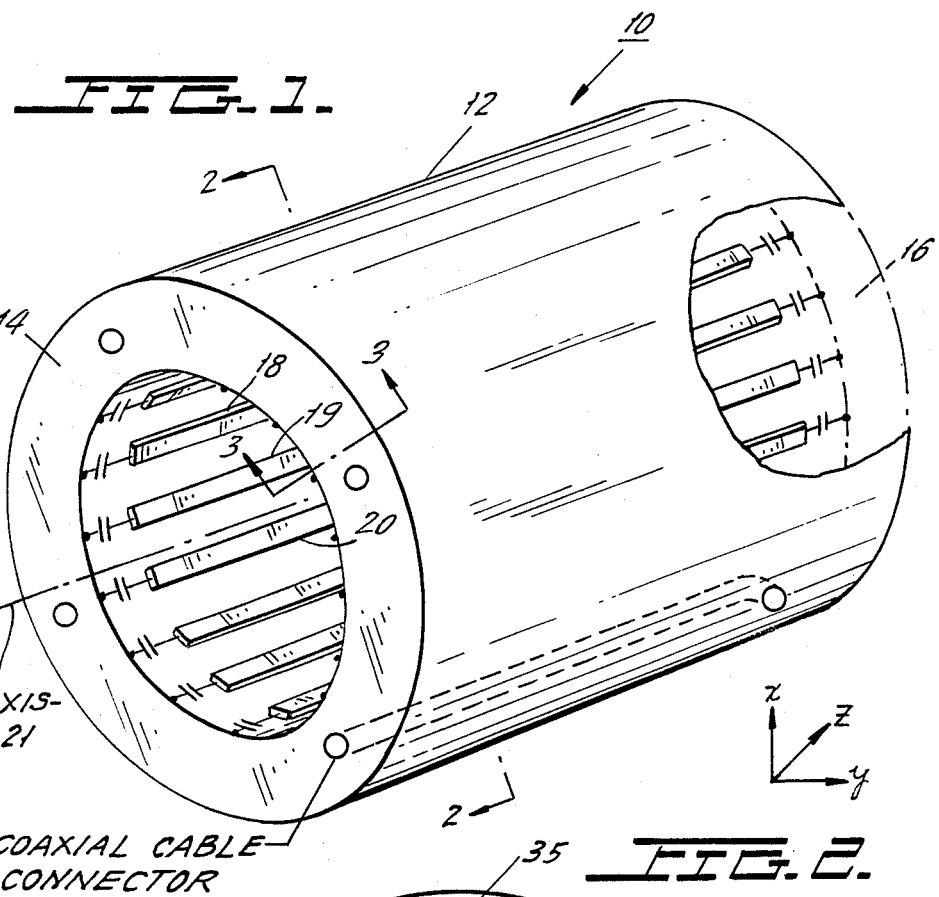
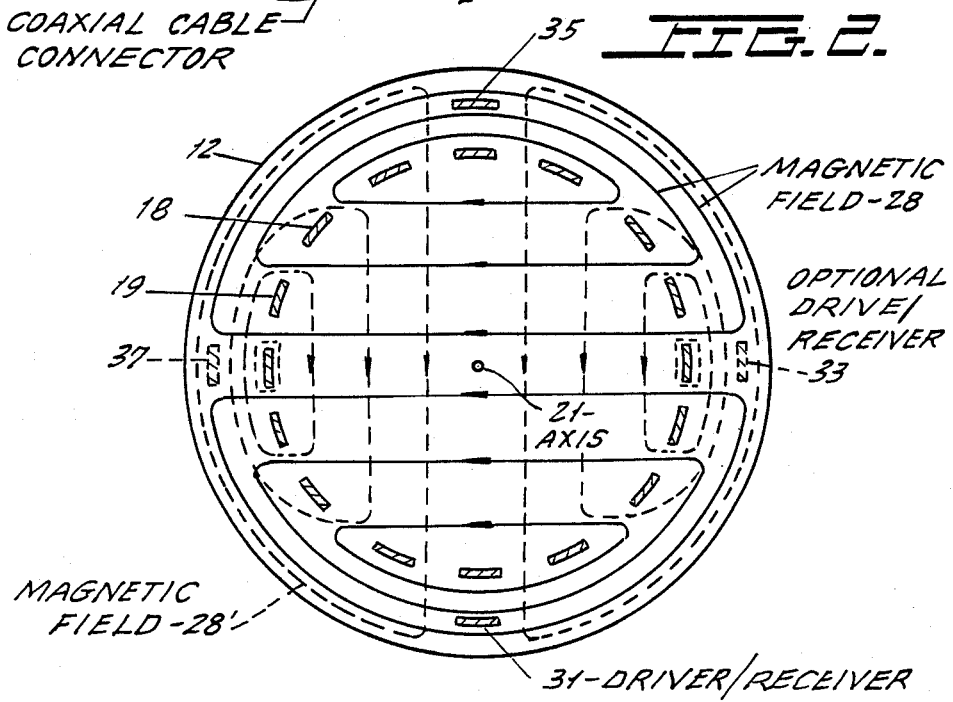

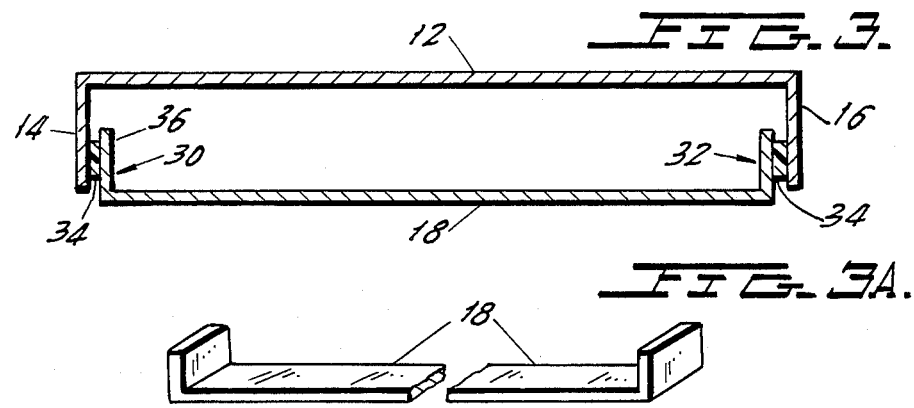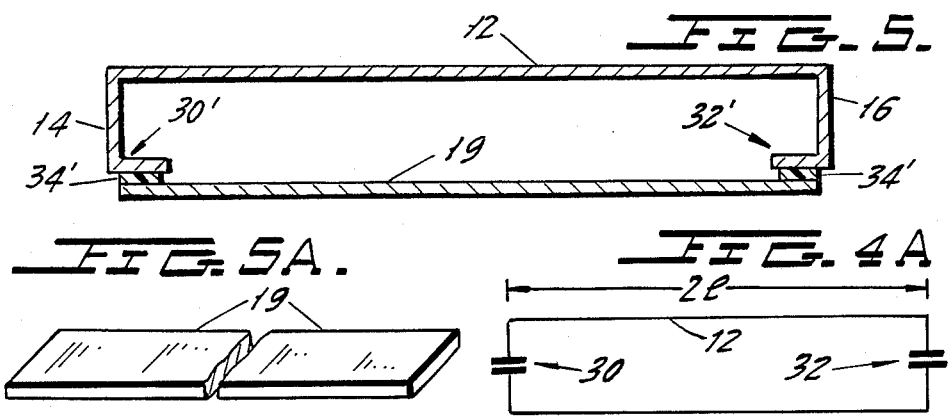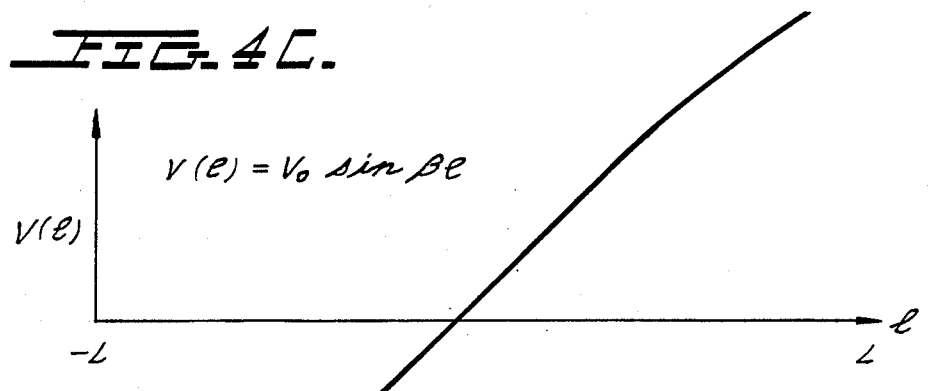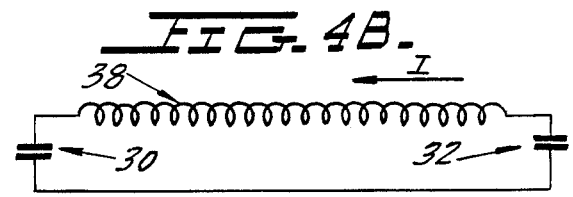

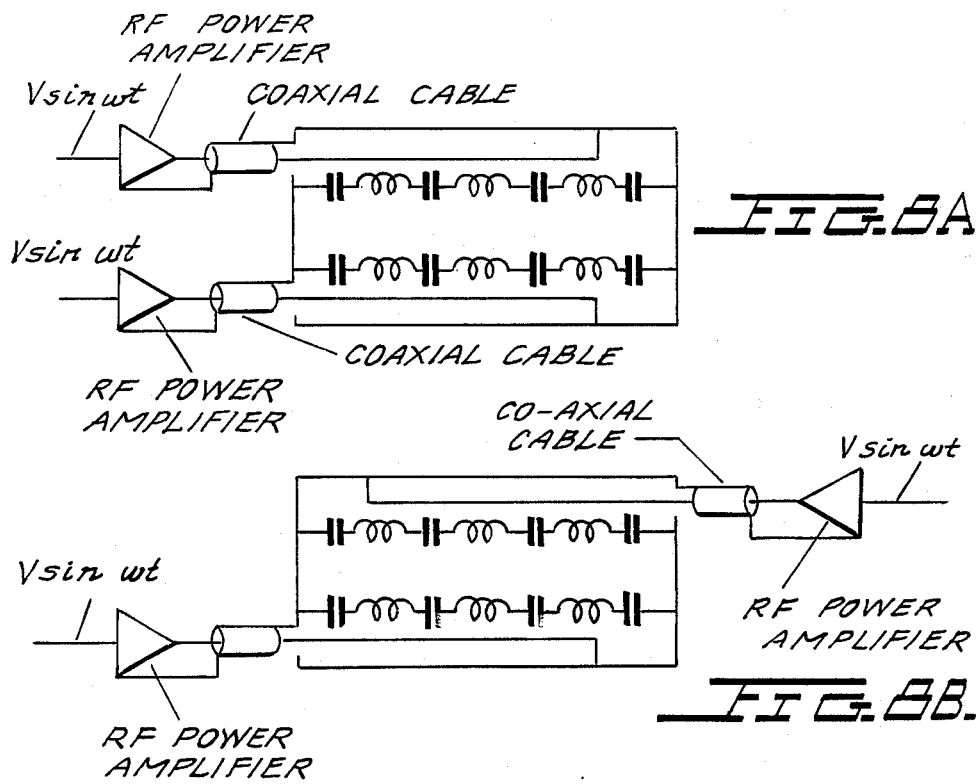
FIG. 8A.
FIG. 8B.
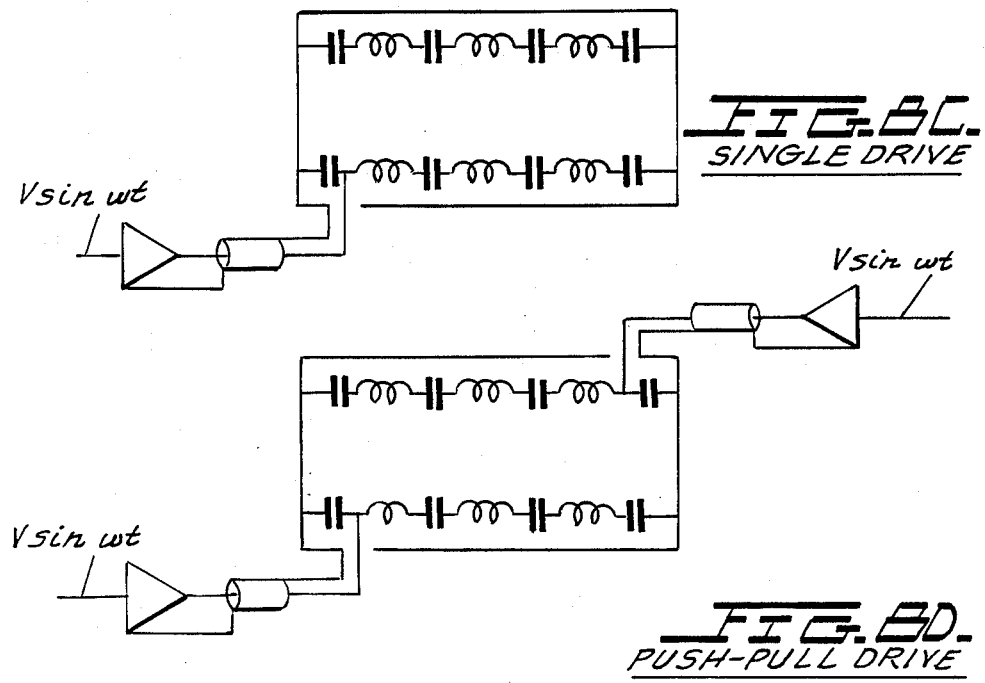
FIG. 8C.
SINGLE DRIVE
FIG. 8D.
PUSH-PULL DRIVE

FUNDAMENTAL MODE

IMAGING MODE

NEXT HIGHER MODE

FIG. 13.
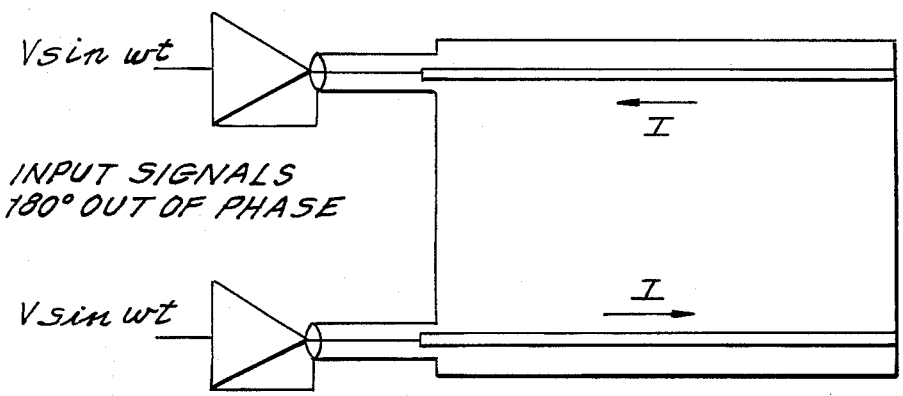
INPUT SIGNALS
180° OUT OF PHASE
FUNDAMENTAL
MODE CANCELLED
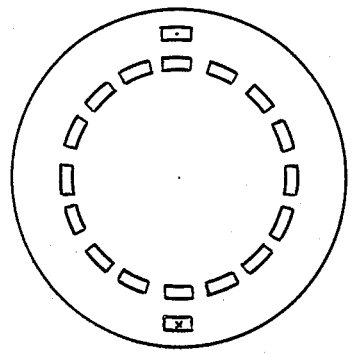
FIG. 13A
IMAGING MODE
ADDITIVE
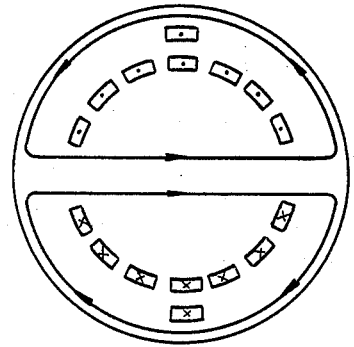
FIG. 13B.
NEXT HIGHER MODE
CANCELLED
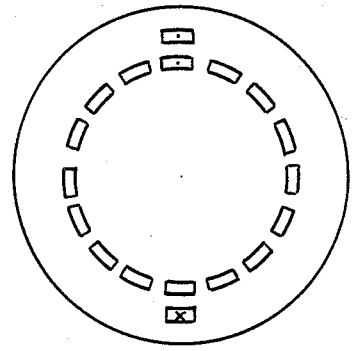
FIG. 13C.

CAVITY RESONATOR WITH IMPROVED MAGNETIC FIELD UNIFORMITY FOR HIGH FREQUENCY OPERATION AND REDUCED DIELECTRIC HEATING IN NMR IMAGING DEVICES

BACKGROUND OF THE INVENTION

1. Field of the Invention

The present invention relates to cavity resonators, such as used in magnetic resonance imaging equipment, in which radio frequency (RF) magnetic fields are generated and received for interaction with a sample being investigated.

2. Description of the Related Art

This high frequency fields of nuclear magnetic resonance (NMR) devices have conventionally been produced by a Helmholtz pair of coils formed in the shape of a saddle. It is a well known principle of electromagnetic theory that uniform magnetic fields are produced by cylindrical current sheets whose current varies sinusoidally with the azimuth. See, e.g., Beth, "Elliptical and Circular Current Sheets to Produce a Prescribed Internal Field." *IEEE Transactions of Nuclear Science*, June 1967, p. 387. Because the saddle shape is only a coarse approximation of a cylindrical current sheet, the magnetic field uniformity produced by a saddle coil configuration is good only near the center of the imaging volume. Moreover, the required length of such coils causes phase shifts of the radio frequency (RF) magnetic field to occur, which further degrades the quality of the RF magnetic field. Thus, NMR devices with saddle coils cannot be used at the higher frequencies of approximately 85 MHz required for high-speed imaging methods, such as disclosed in the co-pending application, Ser. No. 937,529, filed Dec. 3, 1986 entitled "Method of High-Speed Magnetic Resonance Imaging", and U.S. Pat. No. 4,628,264, issued Dec. 9, 1986, entitled "NMR Gradient Field Modulation", both assigned to the present assignee.

U.S. Pat. No. 4,506,224 to Krause, issued Mar. 19, 1985, discloses a conductor system for generating a high-frequency magnetic field formed of an envelope surrounding at least one conductor pair. The envelope is designed to be substantially impervious to high frequencies (to eliminate undesired coupling with external components), but permeable to low frequencies (to allow the magnetic field gradient in). The conductor system geometry approximates that of a saddle coil. Advantageously, the reduced length of the conductor sections allow operation at higher frequencies such as 20 MHz. However, like the conventional saddle coil, the flow of current through the conductors forms only a coarse approximation of a cylindrical current sheet. Thus, the magnetic field uniformity is far from optimal.

U.S. Pat. No. 4,439,733 to Hinshaw et al. is an attempt to approximate the ideal cylindrical current sheet. In the disclosed structure, a plurality of conductive elements are helically wound around a frame in cylindrical relation with respect to the axis along which the static magnetic field of the system is directed. As shown in FIG. 2 of Hinshaw et al., the alternating radio frequency current flows through the conductors in the upper half of the cylinder in an opposite direction to the current flowing through the conductors in the lower half of the cylinder. The conductors are interconnected by sections of transmission line (insulated conductors) such that a standing wave, at a particular frequency, occurs across the conductive system, establishing relative amplitudes of the current in the conductive elements. This results in a substantially uniform magnetic field traverse of the axis of the magnetic resonance system.

The system of Hinshaw et al., however, is limited to low frequencies by the need to wind a many-turn toroid from a single wavelength of cable. Although higher frequencies can be achieved by exposing the center conductor at only two locations, such a coil has a low RF field homogeneity, similar to that of a saddle coil. See, P. Roeschman, *Third Annual Meeting of the Society of Magnetic Resonance in Medicine*, New York, N.Y., Aug. 17–23, 1984, p. 634.

A further prior art design, which is also an approximation of an ideal cylindrical current sheet, is the so-called "birdcage" resonator disclosed in an article by C. Hayes, entitled "An Efficient, Highly Homogeneous Radiofrequency Coil for Whole-Body NMR Imaging at 1.5T", *J. Magn. Reson.*, Vol. 63, pp. 622–28 (1985). This design can be considered to be a further development of the Aldeman-Grant coil. *J. Magn. Reson.*, Vol. 36, p. 447 (1979). The "birdcage" consists of two circular end rings connected by a number of equally spaced straight segments, each which includes a capacitance and has an inherent inductance. An inductance is also present in each of the individual segments of the end rings. The resonance of such a structure is analyzed by Hayes et al. by considering wave propagation around the cylinder. Each of the end ring segments introduces a phase shift. If the total phase shift around the end rings is an integer multiple of $2\pi$, a standing wave is created, which generates currents in the straight segments proportional to $\sin \theta$, thus approximating the ideal current sheet discussed above. Unfortunately, the end rings of the birdcage resonator disclosed by Hayes carry currents which do not approximate the ideal current sheet.

SUMMARY OF THE INVENTION

Accordingly, it is object of the invention to provide a cavity resonator capable of producing a RF magnetic field of high uniformity.

Another object of the invention is to provide a cavity resonator capable of operation at high frequency such as 85 MHz and yet having reasonably small dimensions.

Still another object is to provide a cavity resonator which will effectively contain the radio frequency energy within the imaging volume, while at the same time allowing the gradient magnetic field to be varied within the same volume.

A further object of the invention is to provide a cavity resonator in which dielectric interaction with an object therein is minimized.

These and further objects of the invention are realized in a cavity resonator comprising a plurality of transmission lines having one common conductor. The common conductor has first and second ends and is symmetrically arranged about an axis. Additionally, the common conductor contains the generated RF magnetic field energy.

The transmission lines are symmetrically arranged about the axis. The use of many transmission lines, such as sixteen or more, has been found to provide a highly uniform magnetic field within the resonator. The transmission lines are conductively isolated from each other, but are spaced in sufficiently close proximity to each other that the transmission lines have a strong mutual magnetic coupling to each other.

The transmission lines each have first conductors situated within the common conductor and comprised of a plurality of thin strips of conductive material and a plurality of portions of dielectric material. The conductive strips and dielectric portions are arranged such that each dielectric portion is situated between an adjacent pair of conductive strips so as to form a capacitance. This arrangement has been demonstrated to decrease the peak electric field produced by the transmission line and to thereby minimize dielectric interaction with a sample in the resonator. The first conductors are is connected to the first and second ends of the common conductor by a respective pair of capacitances so as to be capacitively foreshortened. Accordingly, the transmission lines may be only a fraction of the wavelength at the frequency of operation to provide a reasonably compact resonator, with a uniform magnetic field.

The transmission lines are driven by a driver/receiver inductive coupling loop spaced in sufficiently close proximity to the transmission lines so as to have a mutual magnetic coupling to enough of the transmission line to energize the resonator. A second drive loop for each imaging mode may be added which is located 180° in azimuth from the first, in order to improve the field distribution of the imaging mode and cancel the next higher and lower frequency modes.

The common conductor is provided with slits to allow the changing high-speed gradient magnetic fields to fill the imaging volume fast enough to accomplish high-speed imaging. The slits prevent the formation of eddy currents in the common conductor which would create magnetic fields opposing and retarding the desired gradient magnetic fields. First slits are provided at end rings of the common conductor of the transmission lines, and second slits are provided longitudinally along the common conductor. The first slits allow the x and y magnetic field gradients to be established, while the second slits prevent the common conductor from excluding the z-gradient.

The design of the present invention provides improved RF field uniformity along the z-axis away from the mid-plane. In the relatively short RF resonator of the present invention, uniformity is maintained by currents which flow only longitudinally along the transmission lines. The annular end rings produce an image of the current flowing in the transmission lines, thereby increasing the apparent length of the resonator. These image currents, along with the transmission line currents, produce an RF magnetic field near the end rings that is primarily transverse and therefore more uniform than in the 37 birdcage" style coil, in which the currents flow circumferentially in the end conductors. Thus, for equal length "coils", the resonator of the present invention generates a greater volume of uniform RF field.

BRIEF DESCRIPTION OF THE DRAWINGS

Other objects, features and advantages of the invention will be apparent from the following description, together with the accompanying drawings and the appended claims, in which:

FIG. 1 is a simplified view in three dimensions of a cavity resonator of the present invention with portions broken away for ease of illustration;

FIG. 2 is a view taken at arrows 2—2 of FIG. 1 and illustrates a magnetic field produced by transmission lines and the inductively-coupled drive/receptors of the present resonator;

FIG. 3 is a simplified cross-sectional view taken at arrows 3—3 in FIG. 1 and illustrates a preferred implementation of one conductor of the transmission line used in the resonator of the invention;

FIG. 3A is a view in three dimensions of the conductor illustrated in FIG. 3;

FIG. 4A is an electrical representation of a transmission line shown in FIG. 3;

FIG. 4B is an equivalent lumped electrical representation of the transmission line 18 of FIG. 4A;

FIG. 4C illustrates the voltage distribution across the transmission line represented in FIGS. 4A and 4B;

FIGS. 5 and 5A correspond respectively to FIGS. 3 and 3A and illustrate a further implementation of a transmission line that may be used in the present invention;

FIGS. 8A, 8B, 8C, and 8D show various alternate versions of connecting the drivers/receptors to a power source;

FIG. 13 is a side view of the cavity showing the currents in two coupling loops, each driven by an amplifier; and FIGS. 13A, 13B and 13C show the magnetic field distribution with two coupling loops and two amplifiers.

DETAILED DESCRIPTION OF PREFERRED EMBODIMENT

Figure 6:
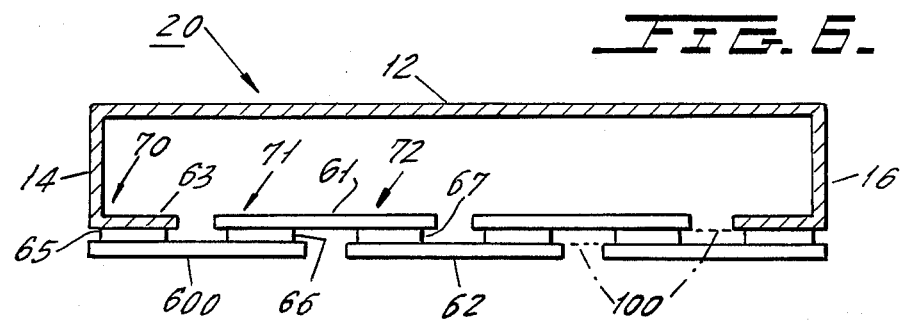
FIGS. 6 and 6A correspond respectively to FIGS. 3 and 3A and illustrate a further embodiment of the invention.

FIG. 1 illustrates a cavity resonator 10 in accordance with the present invention. Resonator 10 is shown in simplified form, and with portions broken away for ease of illustration. Resonator 10 comprises an outer common conductor 12, which acts as a shield to electromagnetic radiation and contains RF magnetic energy. Resonator 10 may comprise copper sheet, for example; is preferably arranged symmetrically about an axis 21; and has end rings 14 and 16 which are annular in shape. Contained within resonator 10 are a plurality of conductors 18, 19 and 20, and so on, which, together with common conductor 12, form a plurality of transmission lines (hereinafter, referred to as simply "transmission lines 18, 19 and 20"). Transmission lines 18, 19 and 20 are each preferably parallel to axis 21, and have their ends respectively coupled to rings 14 and 16 of shield 12 by the illustrated capacitances.

FIG. 2 is a simplified cross-sectional view of transmission lines 18, 19 and 20 taken at arrows 2—2 in FIG.

1. Transmission lines 18, 19 and 20 in FIG. 2 are preferably symmetrically disposed about axis 21, with the preferred number of transmission lines being sixteen or more, which has been found to produce a highly uniform magnetic field 28. The higher the number of transmission lines employed, the greater the uniformity of magnetic field 28, other factors being equal. It is preferred that transmission lines 18, 19 and 20 be spaced equally from each other so as to form a cylindrical current sheet of about 50 percent coverage and spaced equidistant from the common conductor 12 (the shield).

In accordance with an important feature of the invention, transmission lines 18, 19 and 20 have a mutual magnetic coupling that is of a sufficiently high value as to be recognized in the art as "overcoupled". This basically means that each transmission line 18, 19 or 20 has a substantial magnetic coupling to all the other transmission lines in the resonator.

Figure 10:
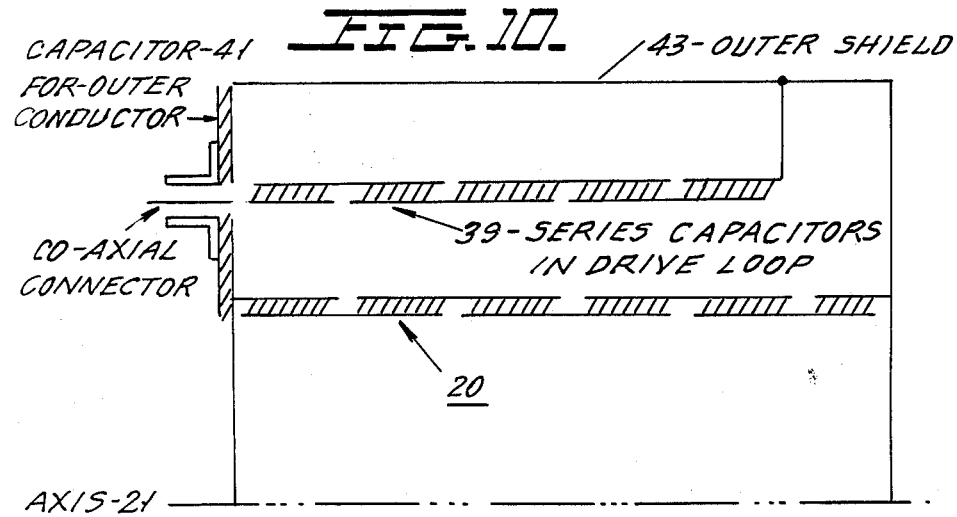
FIG. 10 shows the arrangement of the capacitors in drive loop coupled in series with the inner and outer conductors of the drive line coaxial cable.

Transmission lines 18, 19 and 20 may be driven with driver/receiver 31, which preferably comprises a length of transmission line radially spaced from axis 21 outwardly of transmission lines 18, 19 and 20, but situated within the confines of common conductor 12 (see FIG. 10). Although not shown in the circuit schematic, the driver/receivers are also used to receive the magnetic resonance signal. Driver/receiver 31 has a strong mutual magnetic coupling to all of transmission lines 18, 19 and 20.

Referring to FIG. 10, a capacitor 39 may be added in series to the drive loops to cancel the reactance caused by the self-inductance of the drive loops and to allow the gradient magnetic field to enter the resonator at a rate needed to do the NMR experiment. As discussed below, the resonator has sections which are capacitively low impedance for RF, but have finite large impedance at audio frequencies. A similar capacitor 41 is included in series with the outer conductor 43 of the drive line coaxial cable (shown in FIG. 10). Capacitor 41 is located on the resonator along with the coaxial connector for the drive line. The RF impedance is about 2 ohms, while at audio frequencies (e.g., 1-5 KHz) the impedance is about 170 to 850 KΩ. The inner conductor of the coaxial cable is also a high impedance at audio frequencies, due to the series capacitors in the drive loop described above.

The use of an optional driver/receiver 31 spaced 90° in azimuth, or in spatial quadrature, about axis 21 from driver/receiver 33 (shown by the dashed lines in FIG. 2) provides the beneficial feature of being able to obtain circular polarization of magnetic field 28 where driver/receiver 31 and 33 are driven in phase quadrature. The phase/space quadrature magnetic field (i.e., circularly polarized) must have the correct rotation with respect to the static magnetic field. As the RF magnetic field rotates in one direction, the NMR experiment can be done; if the rotation is in the other direction (against the precessing magnetic moment of the nuclei), then the NMR experiment cannot be done because the nuclei cannot be given energy.

Under some conditions, it is desirable for the loaded coil to have a low Q. Under these conditions, the coupling between the drive loop and the RF coil may change so that the magnetic field of the desired mode is not completely uniform. In addition, due to the multiplicity of transmission lines, undesirable fields of higher order modes in the coil may be excited. These higher order modes begin to overlap in frequency the desired imaging mode, thereby causing distortions in the magnetic field of the imaging mode.

To overcome these two disadvantages, a second drive loop may be added to each orthogonal imaging mode, each loop being driven with an amplifier. The field distribution of the imaging mode is improved and the next higher and lower frequency modes are cancelled.

Figure 12:
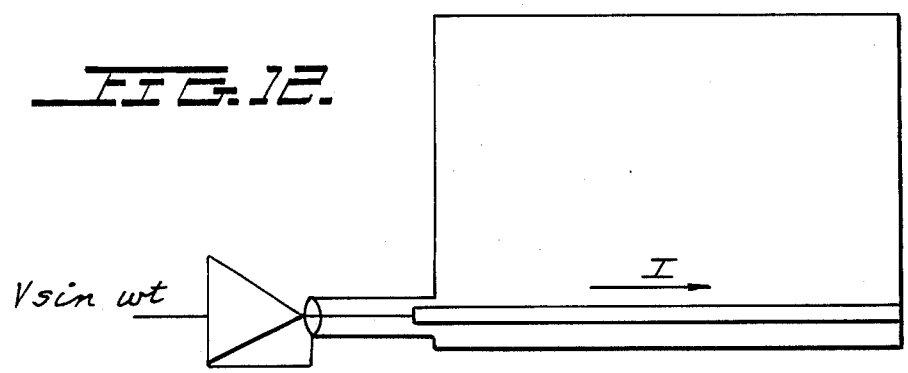
FIG. 12 is a side view of the cavity showing the RF current into a single coupling loop.
Figure 12A:
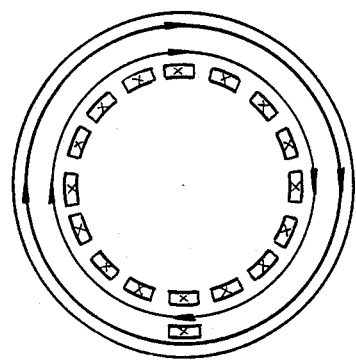
FIGS. 12A, 12B and 12C show the magnetic field distribution for the lowest three modes.
Figure 12B:
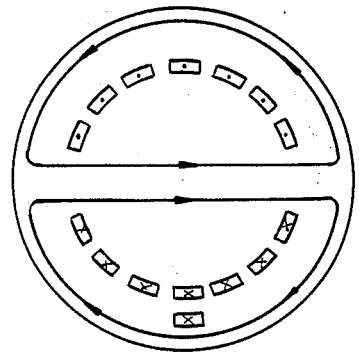
Figure 12C:
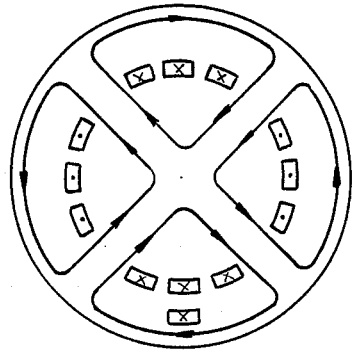

FIG. 12 shows the RF coil with the one drive loop for one of the two linear imaging modes. Currents are indicated by a dot (current out of the plane of the drawing) and a cross (current into the plane of the drawing). The magnetic field lines are in the plane of the drawing with arrowheads showing the direction of the field established by the currents. As shown in FIGS. 12A, 12B and 12C, with only one loop driven, three modes can be excited. If, however, as shown in FIG. 13, two loops are used and driven with the correct phase, then the phase of the currents in the drive loops are still correct for the imaging mode, but are not correct for the modes just higher and just lower in frequency. Since the current in the drive loops are forced to be 180° out of phase, the two undesired modes are cancelled and the field distortion at the imaging frequency is eliminated (see FIGS. 13A, 13B and 13C).

This technique can be extended to all the higher order modes in the coil if they interfere with the spatial uniformity of the magnetic field of the imaging mode.

The two driver/receivers or drive loops for each imaging mode are preferably located 180° apart azimuthally as shown in FIG. 2, where the "second" drive loops for each imaging mode are indicated by reference numerals 35 and 37, respectively. The two loops can be used to drive the resonator in a "push-pull" fashion. This reduces the size of the power amplifier required and also forces the magnetic field inside the resonator to be more ideal, especially when the loading is asymmetric. Two versions, illustrated in FIGS. 8A and 8B, are possible. The resonator may be inductively coupled to the power source, as shown in FIGS. 8A and 8B, or capacitively coupled, as shown in FIGS. 8C and 8D.

By using many power amplifiers (instead of two large ones), the magnetic field can be established in a more ideal way and system reliability may be increased (when one small amplifier fails, the power can be made up by the other amplifiers). The upper limit, of course, would be to have one power source for each of the 16 transmission lines (or two for each transmission line, if push-pull driven), but this would probably be impractical.

A further feature of the invention is illustrated in FIG. 3, which is a simplified view taken at arrows 3—3 in FIG. 1. FIG. 3 illustrates a preferred implementation of a transmission line 18, as opposed to the more schematic representation of transmission line 18 shown in FIG. 1. (Actually, a transmission line has two conductors, so, as mentioned previously, both outer conductor 12 and inner conductor 18 together comprise a transmission line. However, for purposes of clarity, inner conductor 18 is referred to as a "transmission line.")

Transmission line 18 comprises a thin strip of conductive material, such as copper, which is better illustrated in the perspective view of FIG. 3A. In accordance with an important feature of the invention, the axial ends of transmission lines 18 comprise capacitances 30 and 32, formed by interposing dielectric material 34 between a radially directed portion 36 of transmission line 18 and ring portion 14 of common conductor 12. Capacitance 32 is preferably formed in the same way.

The electric field distribution across transmission line 18 is described in connection with FIGS. 4A–4C. Line 18 can be represented as shown in FIG. 4A. FIG. 4B illustrates the equivalent circuit of transmission line 18, where an inductance 38 is serially connected between capacitances 30 and 32. To provide the desired resonance in transmission line 18, the inductive impedance of inductance 38 is selected to be equal to the capacitive impedance of capacitances 30 and 32. Such selection is readily within the purview of those skilled in the art.

FIG. 4C illustrates the voltage distribution across transmission line 18 at a particular instant in time, with the voltage being zero midway of transmission line 18 and having peaks at either axial end of the line. The voltage is actually sinusoidal according to the formula:

$$V(l) = V_o \sin\beta l$$
$$= V_o \sin\theta$$
$$\text{As } \theta \to 0, V(l) \to V_o\theta = V_o\beta l$$

This circuit is often referred to as a "foreshortened transmission line resonator." It is essentially a half-wavelength long open-circuited transmission line which has been "foreshortened" by adding capacitors which have the same impedance as the eliminated transmission line.

FIGS. 5 and 5A are similar to FIGS. 3 and 3A, respectively, and illustrate another embodiment of the invention. Reference numerals with primes are used to refer to like parts as amongst the foregoing similar figures. In FIG. 5, transmission line 19 is shown not to include radially-directed portions such as that designated 36 for transmission line 18 in FIG. 3. As shown in FIG. 5A, transmission line 19 comprises an unbent, thin strip of conductive material, which may be of the same stock as transmission line 18, described above.

The equivalent electrical circuit of transmission line 19, and the electric field distribution there across, are essentially the same as illustrated in FIGS. 4A–4C, which pertain to transmission line 18 of FIG. 3.

Figure 6A:
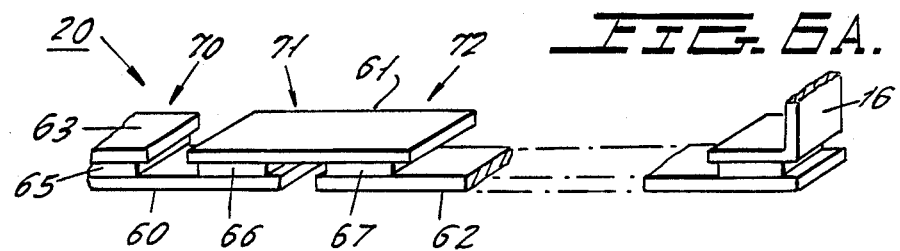

FIGS. 6 and 6A are similar to FIGS. 3 and 3A, respectively, and illustrate a further embodiment of the present invention that is particularly effective in reducing dielectric interaction with a sample in the cavity resonator of the invention. Again, like reference numerals are used to refer to like parts as amongst the foregoing similar figures. In FIG. 6, transmission line 20 can be seen to comprise a plurality of thin conductive strips such as 60, 61 and 62. Axially directed portion 63 of shield 12, depending from ring portion 14, is intended herein to be considered a part of transmission line 20. One conductor of transmission line 20 can also be seen in FIG. 6A. By replacing each capacitor 30, 32 with several, and placing them along conductor 18, the voltage is re-distributed in a manner which reduces the maximum voltage. Note that if only one capacitance 30 or 32 were to be used with each transmission line, there would be a considerably higher electric field produced in the region of the sole capacitance, with undesired dielectric interaction with a sample within cavity resonator 10.

Dielectric material portion 65 is situated between conductors 60 and 63 so as to form as capacitance 70. Similarly, dielectric material portion 66 is situated between conductors 60 and 61 so as to form a capacitor 71. Dielectric material 67 similarly forms a capacitor 72 with conductors 61 and 62.

It is preferred that dielectric material portions 65, 66 and 67 be implemented as a continuous printed circuit board as indicated in phantom at 100 in FIG. 6, with conductors 60, 61 and 62 situated on alternate sides of the printed circuit board.

Figure 7:
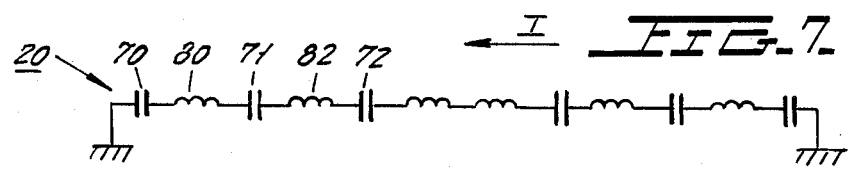
FIG. 7A is an idealized electrical circuit representation of the transmission line illustrated in FIG. 6.
FIG. 7B shows the voltage distribution of the transmission line of FIG. 6.
Figure 7A:
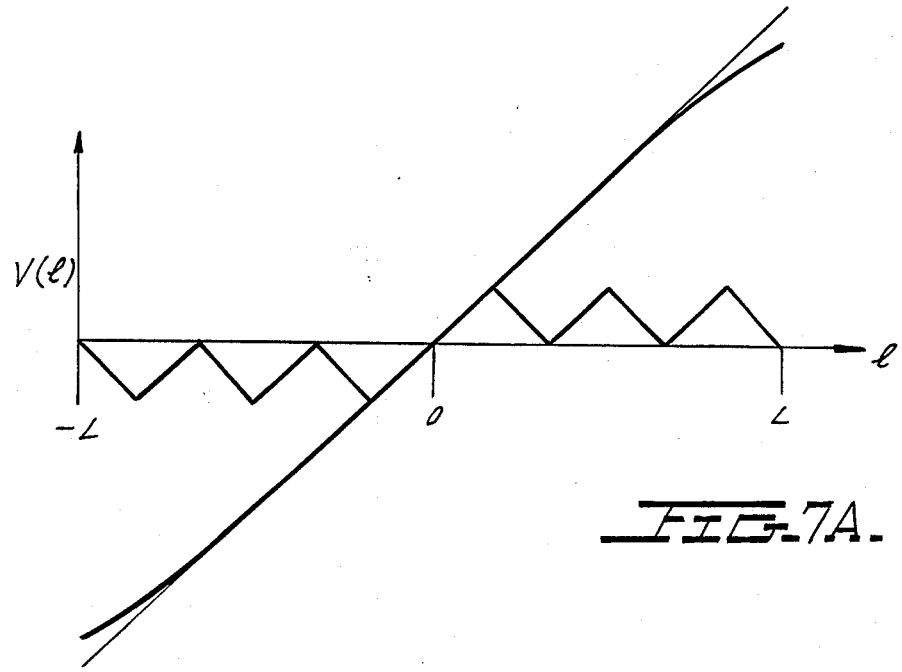

FIG. 7A is an idealized electrical circuit representation of the transmission line illustrated in FIG. 6, and FIG. 7B shows the voltage distribution of the transmission line of FIG. 6.

In FIG. 7A, distributed inductance 80 is serially connected between capacitors 70 and 71, distributed inductance 82 is serially connected between capacitors 71 and 72, and so on. An important beneficial feature of the invention is illustrated in FIG. 7B, wherein the maximum voltage at a particular instant in time on the capacitors of transmissions line 20 is maintained at a lower level than indicated in FIG. 4C in connection with the embodiments of the invention illustrated in FIGS. 3 and 5. Accordingly, the embodiment of the invention illustrated in FIG. 6 is highly effective in reducing unwanted dielectric interaction with a sample within the cavity resonator of the invention.

Figure 9A:
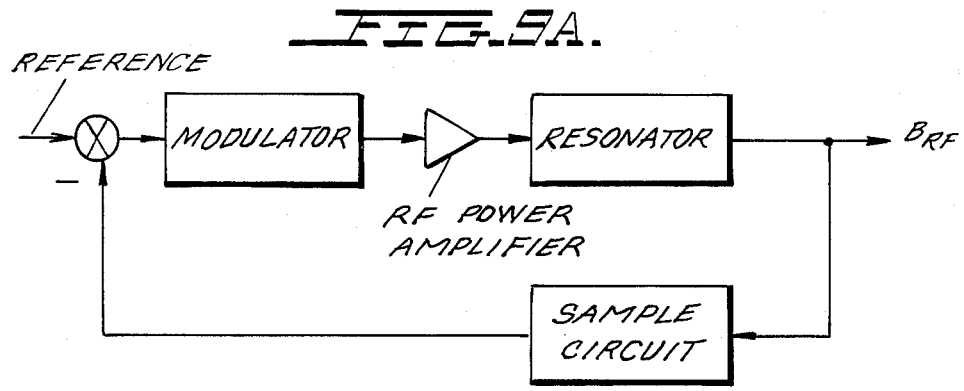
FIGS. 9A and 9B show examples of feedback systems which may be used with the present invention to maintain the correct amplitude of the magnetic field.

By sampling the RF magnetic field and comparing this to a reference, negative feedback can be used in the present invention to maintain the correct amplitude of the magnetic field. An example of a negative feedback system is shown in FIG. 9A. The correction may be done in the low-level (e.g., less than one watt) circuitry of the RF system, for example in the modulator which produces the RF waveforms for the NMR experiment.

Figure 9B:
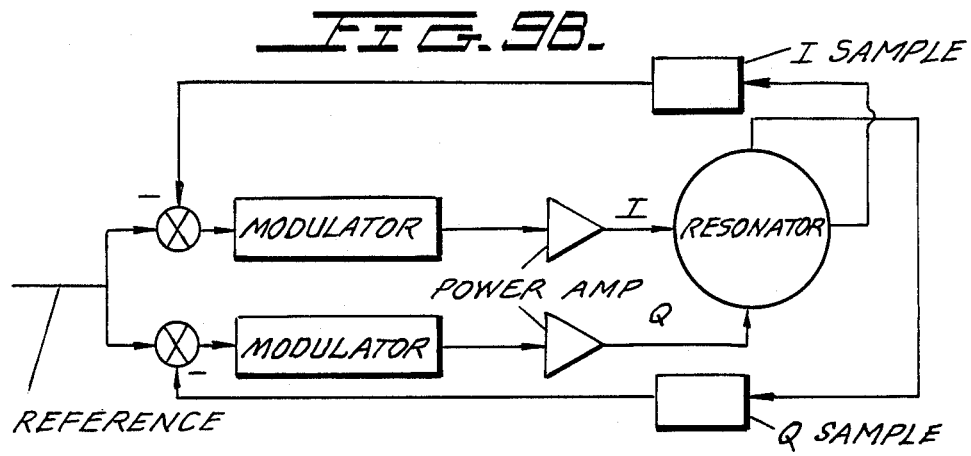

Alternatively, as shown in FIG. 9B, two feedback systems may be used, one for each linear mode, such that a circularly polarized field of constant amplitude is produced, even though the object to be imaged may not be cylindrically symmetric and might, therefore, require more RF power from one channel. To equally load the two amplifiers, the drive loops should be located so that equal power is delivered from each amplifier. However, even with such positioning, it is advantageous to use the feedback system of FIG. 9A or 9B because of internal asymmetries in the body and because the resonator is never perfectly symmetric.

A tuning device may be added to the present invention by coupling a second resonant circuit to the resonator. This circuit would store a small amount of energy compared to the resonator and would be tunable from, for example, 100 to 160 MHz. Changing the resonance of this second circuit changes the total stored energy of the system and would shift the system (resonator+tuning circuit) resonant frequency. Actually, in the preferred embodiment, two tuning devices would be needed, one for each linear orthogonal mode.

Figure 11:
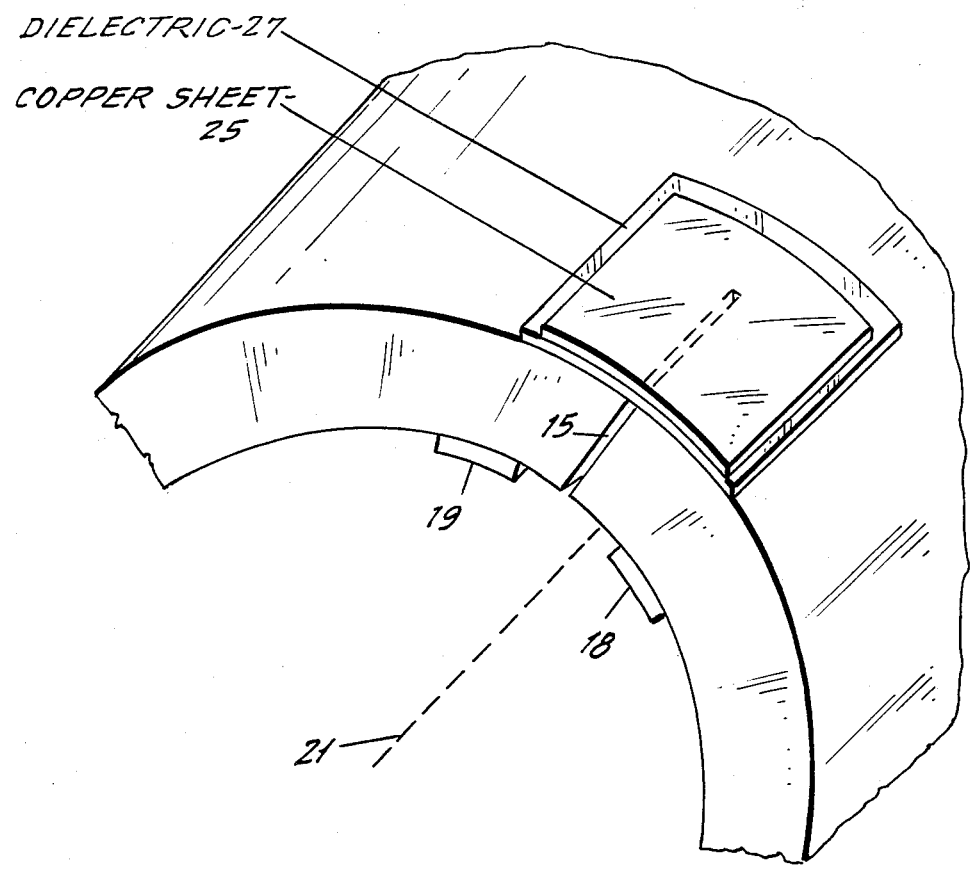
FIG. 11 shows a side perspective view of a slit arrangement in the end rings.

As shown in FIG. 11, the shield may be provided with slits 15 or other apertures radially extending from axis 21 or longitudinal thereto, for example, in order to reduce gradient magnetic field eddy currents in the shield. The slits are placed in the outer shield 12 to allow the changing high speed gradient magnetic fields to fill the imaging volume fast enough to accomplish high speed imaging. Without these openings, the eddy currents in the shield cause magnetic fields which oppose and retard in time the gradient fields. The plurality of slits 15 in the end annular rings 14, 16 and in the outer conductor 12 allow the x and y gradient magnetic fields to be established. Long slits (not shown) may also be provided which extend completely from end to end of the outer shield 12 to prevent the shield 12 from excluding the z-gradient.

As shown in FIG. 11, the annular ring 15 slits on the are covered with copper sheet 25 which is isolated from the shield 12 by a dielectric 27. This arrangement prevents RF energy from entering the cryogenic magnet structure and dissipating energy there, which would lower the Quality Factor, Q, of the resonator and hence the NMR signal.

The deisgn of any resonator requires that the empty resonator have a very high Q compared to the object to be imaged. In such a case, the available RF power is deposited in the true load, where it can be used for the NMR experiment, and not into the resonator, where it only heats up the conductors and contributes nothing to the experiment. In the ideal case, where the resonator is lossless, all the input power is transferred to the object to be imaged (the real "load") and the efficiency of the resonator is 100%. During receiving, the high Q also maintains a high signal-to-noise ratio, since very little noise is added to the NMR signal.

The transmission line approach to building a resonator inherently has a very high Q due to the geometry of the transmission line (flat and broad) and its "closed" form (i.e., the other shield which prevents the RF field from travelling outward and causing loss).

In summary, the structure of the present invention provides a cavity resonator that is particularly useful in highspeed magnetic resonance imaging. The cavity resonator incorporates a plurality of conductively isolated transmission lines symmetrically arranged about an axis of the cavity resonator. The transmission lines are spaced sufficiently close to each other to provide a strong mutual inductive coupling amongst all the transmission lines. For linear magnetic polarization, the transmission lines may be driven, or have signals received therefrom, by providing a single inductive loop preferably situated between an adjacent pair of transmission lines. For circular magnetic polarization, a second inductive loop is provided at a 90° azimuthal spacing from the first inductive loop, and the two inductive loops are driven in phase quadrature. To cancel undesirable frequency modes and eliminate field distortion, two drive loops for each of the imaging modes may be provided, the current in these loops being forced to be 180° out of phase.

Although the present invention has been described in connection with a plurality of preferred embodiments thereof, many other variations and modifications will now become apparent to those skilled in the art. It is preferred, therefore, that the present invention be limited not by the specific disclosure herein, but only the appended claims.

What is claimed is:

1. A cavity resonator for generating and receiving high frequency magnetic fields, comprising:
a plurality of magnetically coupled transmission lines comprising first and second conductors, said first conductor of each transmission line arranged parallel to an axis and having first and second ends;
a common conductor which acts as a shield to contain the magnetic field within the cavity and is arranged symmetrically about said axis and outwardly of said first conductors, said common conductor comprising the second conductor of each transmission line;
said common conductor having first and second ends connected to said first and second ends of each of said first conductors;
said transmission lines being conductively isolated from each other but spaced in sufficiently close proximity to each other so as to have a strong mutual magnetic coupling to each other to produce a substantially uniform dipole magnetic field perpendicular to said axis;
said first conductors of said transmission lines each comprising a plurality of thin strips of conductive material and a plurality of portions of dielectric material;
each of said portions of dielectric material being situated between opposing pairs of said thin conductive material strips so as to form a respective capacitance; a plurality of capacitances of like construction being formed by said conductive strips and said dielectric portions, and at least first and second capacitances of said plurality respectively connecting said first and second ends of said first conductors of said transmission lines to said first and second ends of said common conductor; and at least two driver/receiver inductive coupling loops for each imaging mode located 180° apart azimuthally to cancel the next higher and lower modes, said driver/receiver loops being spaced in sufficiently close proximity to said transmission lines so as to have a mutual magnetic coupling to enough of said lines to energize the imaging mode in the cavity resonator.

2. The cavity resonator of claim 1, wherein said plurality of transmission lines comprises at least sixteen lines.

3. The cavity resonator of claim 1, wherein said plurality of transmission lines is selected in number such that quadrature spacing about said axis exists between two different sets of transmission lines.

4. The cavity resonator of claim 1, further comprising additional driver/receiver inductive coupling loops for each imaging mode located 90° apart azimuthally and driven in phase quadrature to produce a circularly polarized magnetic field within the imaging volume of the cavity resonator.

5. The cavity resonator of claim 1, further comprising more than two driver/receiver inductive coupling loops for each imaging mode to cancel modes higher than said next higher mode.

6. The cavity resonator of claim 5, wherein said plurality of driver/receiver inductive coupling loops drive the resonator in a push-pull arrangement.

7. The cavity resonator of claim 5, wherein said plurality of driver/receivers are inductively coupled to the resonator.

8. The cavity resonator of claim 5, wherein said plurality of driver/receivers are capacitively coupled to the resonator.

9. The cavity resonator of claim 5, wherein said plurality of driver/receiver inductive coupling loops are driven by a plurality of power sources.

10. The cavity resonator of claim 1, wherein said plurality of capacitances comprises at least a third capacitance serially connected between said first and second capacitances in said transmission lines.

11. The cavity resonator of claim 1, wherein said plurality of capacitances comprises at least six capacitances interspersed in serial fashion along said transmission line.

12. The cavity resonator of claim 1, wherein said plurality of dielectric portions of said transmission line comprises a printed circuit board substrate which has been etched to include at least several of said plurality of conductive strips of said transmission line mounted in such a fashion as to form a plurality of capacitances serially connected along said transmission lines.

13. The cavity resonator of claim 1, further comprising a negative feedback system to maintain the correct amplitude of the magnetic field.

14. The cavity resonator of claim 1, wherein said common conductor has first slits at said first and second ends, and second slits extending longitudinally across said common conductor between said first and second ends, said first slits cooperating with respective layers of insulating and conductive material to form capacitors at said first and second ends to restrict RF energy from leaving said cavity, said second slits serving to allow gradient magnetic field energy in the audio frequency range to enter said cavity.

15. The cavity resonator of claim 1, further comprising a tuning device comprising a separate resonant circuit storing a substantially smaller amount of energy than said cavity resonator.

16. The cavity resonator of claim 15, further comprising two of said tuning devices, one for each imaging mode.

* * * * *